(12) United States Patent
Li et al.

(10) Patent No.: US 10,886,360 B2
(45) Date of Patent: Jan. 5, 2021

(54) DISPLAY PANEL AND MANUFACTURING METHOD THEREOF

(71) Applicants: Hefei Xinsheng Optoelectronics Technology Co., Ltd., Anhui (CN); BOE Technology Group Co., Ltd., Beijing (CN)

(72) Inventors: Jiewei Li, Beijing (CN); Dandan Zang, Beijing (CN); Yachao Tong, Beijing (CN); Chuan Yin, Beijing (CN); Xianjiang Xiong, Beijing (CN); Yong Cui, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/565,807

(22) Filed: Sep. 10, 2019

(65) Prior Publication Data

US 2020/0203469 A1 Jun. 25, 2020

(30) Foreign Application Priority Data

Dec. 25, 2018 (CN) .......................... 2018 1 1590608

(51) Int. Cl.
*H01L 27/32* (2006.01)
*H01L 51/52* (2006.01)
*H01L 51/56* (2006.01)

(52) U.S. Cl.
CPC ...... *H01L 27/3279* (2013.01); *H01L 27/3246* (2013.01); *H01L 51/5212* (2013.01);
(Continued)

(58) Field of Classification Search
CPC ............ H01L 27/3279; H01L 27/3246; H01L 51/5212; H01L 51/5228
See application file for complete search history.

(56) References Cited

U.S. PATENT DOCUMENTS 9,806,279 B2 10/2017 Im et al.
10,431,768 B2 10/2019 Lee et al.
(Continued)

FOREIGN PATENT DOCUMENTS

CN 101055889 A 10/2007
CN 101847649 B 5/2014
(Continued)

OTHER PUBLICATIONS

Apr. 29, 2020—(CN) First Office Action Appn 201811590608.9 with English Translation.

*Primary Examiner* — Dung A. Le
(74) *Attorney, Agent, or Firm* — Banner & Witcoff, Ltd.

(57) ABSTRACT

A display panel and a manufacturing method thereof. The display panel includes a base substrate, and a pixel area and a non-pixel area on the substrate. The pixel area includes a light emitting element, the light emitting element including a first electrode, a light emitting layer, and a second electrode which are sequentially on the base substrate; the non-pixel area includes a first structural area, the first structural area including a conductive supporting block on one side of the light emitting layer close to the base substrate; the display panel further includes an electric connection layer which is on one side, which is away from the base substrate, of the light emitting element and the first structural area; the second electrode of the light emitting element is electrically connected with the electric connection layer, and is electrically connected with the conductive supporting block through the electric connection layer.

20 Claims, 2 Drawing Sheets

(52) U.S. Cl.
CPC .......... *H01L 51/5228* (2013.01); *H01L 51/56* (2013.01); *H01L 2227/323* (2013.01)

(56) References Cited

U.S. PATENT DOCUMENTS

| | | |
|---|---|---|
| 2007/0241671 A1 | 10/2007 | Kai et al. |
| 2010/0244070 A1 | 9/2010 | Lee et al. |
| 2015/0091030 A1* | 4/2015 | Lee .................... H01L 27/3258 257/91 |
| 2016/0204171 A1 | 7/2016 | Lee et al. |

FOREIGN PATENT DOCUMENTS

| | | |
|---|---|---|
| CN | 104393188 A | 3/2015 |
| CN | 105261632 A | 1/2016 |
| CN | 105789477 A | 7/2016 |
| CN | 106057844 A | 10/2016 |
| CN | 106206645 A | 12/2016 |
| CN | 107565041 A | 1/2018 |
| CN | 109004105 A | 12/2018 |
| JP | 2005093397 A | 4/2005 |

\* cited by examiner

DISPLAY PANEL AND MANUFACTURING METHOD THEREOF

CROSS REFERENCE TO RELATED APPLICATIONS

The present application claims priority of Chinese Patent Application No. 201811590608.9 filed on Dec. 25, 2018, the disclosure of which is incorporated herein by reference in its entirety as part of the present application.

TECHNICAL FIELD

Embodiments of the present disclosure relate to a display panel and a manufacturing method thereof.

BACKGROUND

An organic light emitting diode (OLED) display panel includes a pixel defining layer and a plurality of organic light emitting diodes, each of the plurality of organic light emitting diodes including a first electrode (one of a cathode and an anode) and a second electrode (the other of the cathode and the anode). The pixel defining layer includes a plurality of pixel openings, in each of which, an organic light emitting diode is provided. The first electrode of the organic light emitting diode is located within a corresponding pixel opening, and the second electrode of the organic light emitting diode is formed as an entire surface of electrode, a part of which falls into the pixel opening, and the remaining part of which is covered on the pixel defining layer.

In order to ensure that the second electrode has a good light transmittance, usually, the second electrode is provided to be very thin. However, the thinner the first electrode, the larger the transverse resistance of the first electrode, thereby resulting in a relatively large voltage drop (IR Drop) caused by the first electrode during display, which further leads to inconsistent brightness of a display surface at an edge and in the middle during display (usually, bright in the middle and dark at the edges).

Therefore, how to reduce the voltage drop of the organic light emitting diode display panel during display has become a technical problem to be solved urgently in the art.

SUMMARY

Embodiments of the present disclosure provide a display panel, comprising a base substrate, and a pixel area and a non-pixel area outside the pixel area on the base substrate. The pixel area comprises a light emitting element, the light emitting element comprising a first electrode, a light emitting layer, and a second electrode which are sequentially on the base substrate; the non-pixel area comprises a first structural area, the first structural area comprising a conductive supporting block which is at one side of the light emitting layer close to the base substrate; the display panel further comprises an electric connection layer which is at a side, which is away from the base substrate, of the light emitting element and the first structural area; the second electrode of the light emitting element is electrically connected with the electric connection layer, and is electrically connected with the conductive supporting block through the electric connection layer.

In some examples, the conductive supporting block comprises an insulating block and a conductive layer cladding the insulating block, and the electric connection layer is electrically connected with the conductive layer.

In some examples, the non-pixel area further includes a second structural area between the pixel area and the first structural area, the second structural area comprises a groove exposing at least a part of a side surface of the conductive layer, and the electric connection layer is electrically connected with the at least a part of the side surface of the conductive layer through the second structural area.

In some examples, the farther away from the base substrate, the greater a cross sectional area of the insulating block in a direction parallel with the base substrate is.

In some examples, the first structural area further comprises an auxiliary electrode wire at one side of the conductive supporting block close to the base substrate, and the auxiliary electrode wire is electrically connected with the conductive layer.

In some example, a surface of the auxiliary electrode wire close to the conductive layer has a portion which is exposed by the insulating block, and the conductive layer is electrically connected with the auxiliary electrode by directly contacting the exposed portion without via holes.

In some examples, the display panel further comprises a driving circuit for driving the light emitting element to emit light, the driving circuit located at one side of the light emitting element close to the base substrate. The driving circuit comprises a thin film transistors which comprises a plurality of driving electrode layers spaced apart from each other, and the auxiliary electrode wire is in a same layer and made of a same material as one of the plurality of driving electrode layers.

In some examples, the plurality of driving electrode layers of the thin film transistor comprise a source-drain electrode layer and a gate electrode layer, the auxiliary electrode wire is provided in a same layer as the gate electrode layer or the source-drain electrode layer.

In some examples, the thin film transistor further comprises an interlayer insulating layer which is provided between the gate electrode layer and the source-drain electrode layer, to insulate the gate electrode layer from the source-drain electrode layer, and the insulating block comprises an interlayer insulating portion which is in a same layer and made of a same material as the interlayer insulating layer.

In some examples, the interlayer insulating layer comprises a first interlayer insulating layer, a second interlayer insulating layer and a third interlayer insulating layer which are sequentially stacked in a direction away from the base substrate, wherein the first interlayer insulating layer is made of silicon oxide, the second interlayer insulating layer is made of silicon oxynitride, and the third interlayer insulating layer is made of silicon nitride; the interlayer insulating portion comprises a first interlayer insulating portion which is in a same layer and made of a same material as the first interlayer insulating layer, a second interlayer insulating portion which is in a same layer and made of a same material as the second interlayer insulating layer, and a third interlayer insulating portion which is in a same layer and made of a same material as the third interlayer insulating layer.

In some examples, the display panel further comprises a planarization layer between the driving circuit and the light emitting element, and the insulating block comprises a planarization portion which is provided in a same layer and made of a same material as the planarization layer.

In some examples, the planarization layer and the planarization portion are both made of a negative photoresist.

In some examples, the display panel further comprises a passivation layer between the driving circuit and the planarization layer, and the insulating block further comprises a passivation portion which is in a same layer and made of a same material as the passivation layer.

In some examples, the passivation portion comprises silicon nitride, and a silicon content in the passivation portion gradually increases in a direction away from the base substrate.

In some examples, the display panel further comprises a plurality of pixel areas arranged in an array along a first direction and a second direction, and a plurality of first structural areas arranged in a second array along the first direction and the second direction, and a plurality of auxiliary electrode wires, between every two rows of pixel areas is provided with one row of first structural area.

In some examples, the display panel further comprises a plurality of auxiliary electrode wires which are extended in the second direction and are corresponding to the plurality columns of first structural areas in a one-to-one correspondence. Each auxiliary electrode wire is between two adjacent columns of pixel areas, and the conductive layers in each column of first structural areas are electrically connected with one auxiliary electrode wire corresponding to the each column of first structural areas.

In some examples, the conductive layer is in a same layer and made of a same material as the first electrode of the light emitting element.

In some examples, the display panel further comprises a plurality of pixel areas, and a plurality of second electrodes of the plurality of pixel areas are electrically connected with each other to be an integral structure.

In some examples, the pixel area further comprises a thin film transistor electrically connected with the light emitting element; the thin film transistor comprises an interlayer insulating layer which is between a gate electrode layer and a source-drain electrode layer of the thin film transistor; the pixel area further comprises a passivation layer and a planarization layer between the thin film transistor and the light emitting element, and the passivation layer is on a side of the planarization layer close to the base substrate. The first structural area further comprises an auxiliary electrode wire on a side of the conductive supporting block close to the base substrate; the conductive supporting block comprises an insulating block and a conductive layer sequentially on the auxiliary electrode wire, and the conductive layer dads the insulating block and is electrically connected with the auxiliary electrode wire by direct contact without via holes. The insulating block comprises an interlayer insulating portion, a passivation portion and planarization portion which are sequentially on the auxiliary electrode wire. The interlayer insulating portion is in a same layer and made of a same material as the interlayer insulating layer, the passivation portion is in a same layer and made of a same material as the passivation layer, and the planarization portion is in a same layer and made of a same material as the planarization layer.

Embodiments of the present disclosure further provide a manufacturing method of a display panel, the display panel comprising a pixel area and a non-pixel area outside the pixel area. The manufacturing method comprises: providing a base substrate; forming a light emitting element in the pixel area, comprising forming a first electrode, a light emitting layer and a second electrode on the base substrate sequentially; forming a first structural area in the non-pixel area, comprising forming a conductive supporting block at a side of the light emitting layer close to the base substrate; forming an electric connection layer at a side, which is away from the base substrate, of the light emitting element and the first structural area. The second electrode of the light emitting element is electrically connected with the electric connection layer, and is electrically connected with the conductive supporting block through the electric connection layer.

In some examples, the manufacturing method further comprises forming a second structural area in the non-pixel area. The second structural area comprises a groove exposing at least a side surface of the conductive layer, and the electric connection layer is electrically connected with the exposed side surface of the conductive layer through the second structural area.

In some examples, the first electrode of the light emitting element and the conductive layer are formed in a same patterning process.

In some examples, the electric connection layer is formed using an atomic layer deposition process.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DESCRIPTION OF THE REFERENCE NUMERALS

| 100: pixel area | 110: light emitting element |
| 111: first electrode | 112: second electrode |
| 113: light emitting layer | 120: pixel defining layer |
| 130: thin film transistor | 131: interlayer insulating layer |
| 132: passivation layer | 133: planarization layer |
| 200: second structural area | 300: first structural area |
| 310: auxiliary electrode wire | 320: conductive supporting block |
| 321: insulating block | 321a: interlayer insulating portion |
| 321b: passivation portion | 321c: planarization portion |
| 400: electric connection layer | 500: base substrate |
| 322: conductive layer | 101: non-pixel area. |

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1:
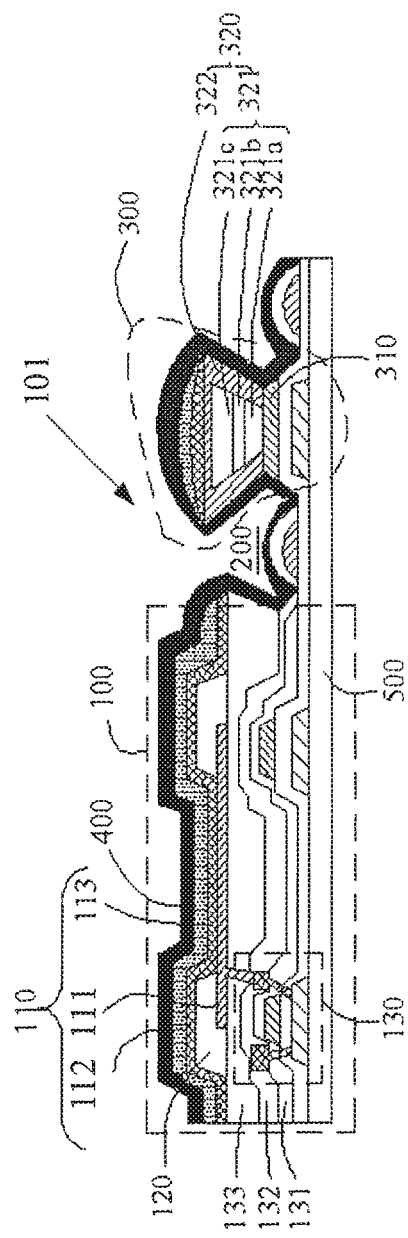
FIG. 1 is a sectional view of a part of a display panel according to some embodiments of the present disclosure.

FIG. 1 is a sectional view of a part of a display panel according to some embodiments of the present disclosure. As shown in FIG. 1, the display panel includes a base substrate 500, and a pixel area 100 and a non-pixel area 101 outside the pixel area 100 provided on the base substrate 500.

The pixel area 100 includes a light emitting element 110. The light emitting element 110 includes a first electrode 111, a light emitting layer 113 and a second electrode 112 which are sequentially provided on the base substrate. The display panel is, for example, an organic light emitting diode display panel, and the light emitting element 110 is, for example, an organic light emitting diode.

The non-pixel area 101 includes a first structural area 300. The first structural area 300 includes a conductive supporting block 320 which is provided at one side of the light emitting layer 113 close to the base substrate 500.

The display panel further includes an electric connection layer 400 which is provided at a side, which is away from the base substrate 500, of the light emitting element 110 and the first structural area 300. The second electrode 112 of the light emitting element 110 is electrically connected with the electric connection layer 400, and is electrically connected with the conductive supporting block 320 through the electric connection layer 400.

For example, the conductive supporting block 320 includes an insulating block 321 and a conductive layer 322 cladding the insulating block 321, i.e., the conductive layer 322 covers at least a part of a side surface of the insulating block 321. The electric connection layer 400 is electrically connected with the conductive layer 322.

Figure 2:
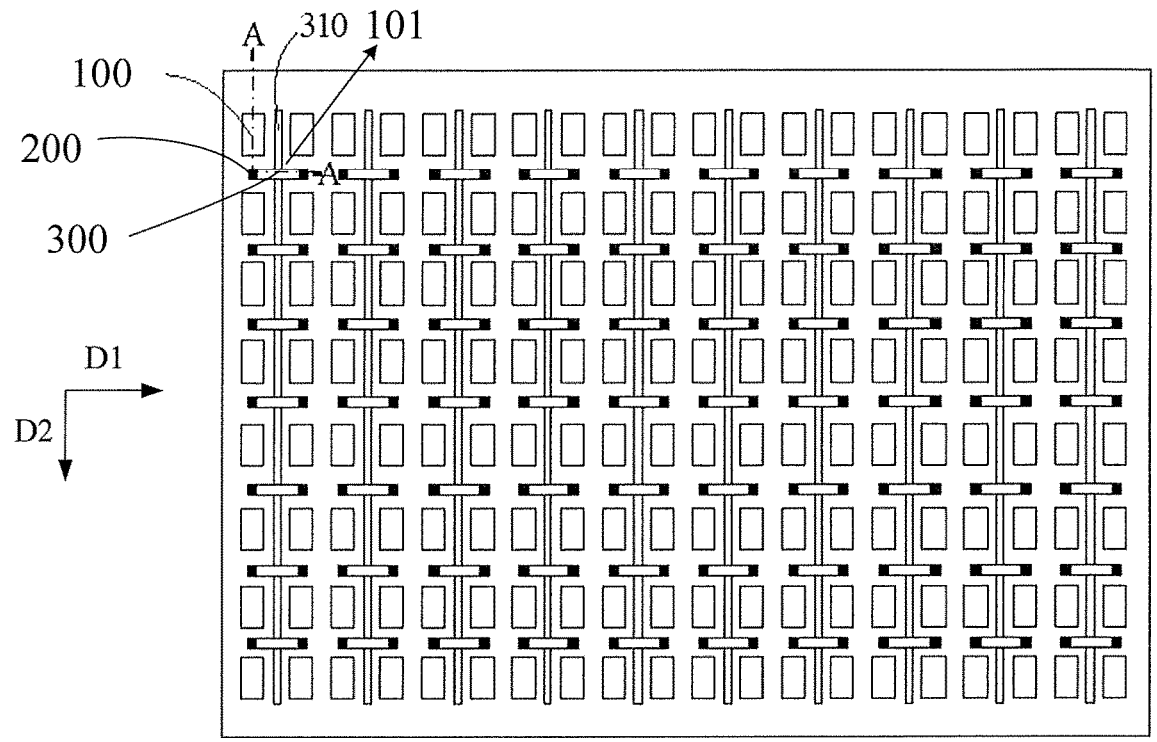
FIG. 2 is schematic top view of the display panel according to some embodiments of the present disclosure.

For example, the first structural area 300 further includes an auxiliary electrode wire 310 located at one side of the conductive supporting block 320 close to the base substrate 500, and the auxiliary electrode wire 310 is electrically connected with the conductive layer 322 by direct contact, for example. The second electrode 112 of the light emitting element 110 is electrically connected with the auxiliary electrode wire 310 through the electric connection layer 400. For example, the conductive layer 322 is electrically connected with the auxiliary electrode wire 310 through direct contact by overlapping without via holes. As illustrated in FIG. 2, the insulating block 321 is on a top surface of the auxiliary electrode wire 310 and an area of a bottom surface of the insulating block is smaller than an area of the top surface of the auxiliary electrode wire 310; that is, the top surface of the auxiliary electrode wire 310 has a portion uncovered by the insulating block 321. The conductive layer 322 directly overlaps and contacts the uncovered portion of the top surface to establish an electrical connection with the auxiliary electrode wire 310.

For example, the non-pixel area 101 further includes a second structural area 200 between the pixel area 100 and the first structural area 300. The second structural area 200 includes a groove 201 exposing at least a side surface of the conductive layer 322. The electric connection layer 400 is electrically connected with the side surface, which is exposed by the groove 201, of the conductive layer 400, through the second structural area 200.

For example, the groove also exposes at least a part of the side surface of the auxiliary electrode wire 310, and the electric connection layer 400 may be also electrically connected with the side surface, which is exposed by the groove 201, of the auxiliary electrode wire 310, through the second structural area 200.

FIG. 2 is a top view of a display panel according to some embodiments of the present disclosure. For example, FIG. 1 is a sectional view of FIG. 2 along A-A direction. As shown in FIG. 2, the display panel may include a plurality of pixel areas 100, for example, arranged in an array with a plurality of rows and columns along a first direction D1 and a second direction D2. A plurality of first structural areas 300 and a plurality of second structural areas 200 are provided in the non-pixel area 101. For example, a lengthwise direction of the first structural area 300 is along the first direction D1 (i.e. a row direction of the array). For example, one second structural area 200 is provided at two sides of each of the first structural areas 300 respectively.

For example, as illustrated in FIG. 2, a plurality of first structural areas 300 arranged in an array along the first direction D1 and the second direction D2, and between every two rows of pixel areas 100 is proved with one row of first structural areas 300. For example, each first structural area 300 corresponds to two adjacent pixel areas 100 in a same row, and in the first direction D1, a length of the first structural area 300 is less than a length of the corresponding two adjacent pixel areas 100. For example, a plurality of auxiliary electrode wires 310 are extended along the second direction D2 (i.e. a column direction of the array), and each auxiliary electrode wire 310 is provided between two adjacent columns of pixel areas 100. For example, the plurality of auxiliary electrode wires 310 are corresponding to the plurality columns of first structural areas 300 in a one-to-one correspondence, and the conductive layers 322 in each column of first structural areas 300 are electrically connected with one auxiliary electrode wire 310 corresponding to the each column of first structural areas 300; that is, the conductive layers 322 in each column are electrically connected with each other through one corresponding auxiliary electrode wire 310. For example, an orthographic projection of the auxiliary electrode wire 310 on the base substrate 500 is orthogonal to and overlapped with an orthographic projection of the corresponding first structural area 300 on the base substrate 500.

For example, a plurality of second electrodes 112 in the plurality of pixel areas are electrically connected with each other to be an integral electrode material layer, i.e., the electrode material layer has a continuous structure of an entire surface, and a gap, which may be a partial split, is formed at a position corresponding to the second structural area 200, but the whole electrode material layer is in a continuous structure.

In another example, the first structural area 300 is provided at a spacing between adjacent pixel areas 100, and the second structural area 200 is provided around the first structural area 300 to space the pixel area 100 apart from the first structural area 300.

It should be noted that the first structural area 300 may be provided between any two adjacent pixel areas 100, or provided between some of the first structural areas 100 selectively.

For the display panel, the electrode material layer is typically made of a transparent or translucent electrode material (e.g., an ITO material). The thinner the electrode material layer, the higher the light transmittance, but the lower the electric conductivity, the higher the voltage drop (IR-drop) on the electrode material layer, which easily leads to uneven brightness of the display panel. The display panel provided by the embodiments of the present disclosure can reduce a resistance of the electrode material layer by proving the electric connection layer to electrically connect the electrode material layer and the conductive supporting block to form a parallel structure, thereby reducing the voltage drop on the electrode material layer and alleviating the uneven brightness problem of the display panel caused by the IR drop.

For example, the conductive layer 322 fully wraps the other surfaces than the bottom surface of the insulating block 321, which helps to increase the area of the conductive layer 322 and reduce the resistance of the conductive layer 322, thereby further reducing the resistance of the electrode material layer.

In some embodiments, the electric connection layer 400 is further electrically connected with the auxiliary electrode wires 310 to form a parallel structure, so as to further reduce the resistance of the electrode material layer. For example, the auxiliary electrode wire 310 is usually made of a metal material having a resistivity lower than that of the transparent electrode material. The second electrode layer is electrically connected with the conductive layer 322 and the auxiliary electrode wire 310 through the electric connection layer 400 respectively to form a parallel structure with a resistance much less than that of the electrode material layer itself. Therefore, when the display panel is powered to drive the light emitting element to emit light, the electrical signal is transmitted through the parallel structure formed by the electrode material layer, the conductive layer 322 and the auxiliary electrode wire 310. Compared with the prior art in which the electrical signal is transmitted only through the electrode material layer, obviously, the display panel according to the present disclosure has a less voltage drop (IR Drop) during display, thereby improving uniformity of the display panel in display.

In the present disclosure, the specific structure of the light emitting element is not particularly limited. For example, the light emitting element may be an organic light emitting diode (OLED) or a quantum dot light emitting diode (QLED); accordingly, the material of the light emitting layer 113 is the organic light emitting material or the quantum dot light emitting material.

When the light emitting element emits light, the conductive layer 322 and the auxiliary electrode wire 310 are both located at a backlight side of the light emitting element. Therefore, the conductive layer 322 and the auxiliary electrode wire 310 do not affect the normal light emission of the light emitting element. Since there exists a distance between the auxiliary electrode wire 310 and the electrode material layer, the auxiliary electrode wire 310 is electrically connected with the electrode material layer through the conductive layer 322, so that a stable electric connection is formed therebetween.

Also, the conductive layer 322 is clad outside the insulating block 321 to reduce the difficulty in forming the conductive supporting block 320. In an embodiment of the present disclosure, the first structural area 300 and the pixel area 100 are separated by the second structural region 200 formed as a groove, which avoid the influence of the first structural area 300 on the structure in the pixel area 100.

In this disclosure, how to electrically connect the electrode material layer with the auxiliary electrode wire 310 is not particularly limited. For example, the electrode material layer may be electrically connected with the auxiliary electrode wires 310 by providing an electric connection member in the second structural area 100. For example, as shown in FIG. 1, the display panel further includes an electric connection layer 400 which extends through the pixel area 100, the second structural area 200 and the first structural area 300. The electrode material layer is electrically connected with the conductive layer 322 through the electric connection layer 400, such that the electrode material layer is electrically connected with the auxiliary electrode wire 310.

For example, the electric connection layer 400 covers the electrode material layer, and is attached to the side surfaces of the conductive layer 322 and the auxiliary electrode wire 310 to form a plurality of electric connections, thereby ensuring that the electrode material layer and the auxiliary electrode wire form the parallel structure.

In order to reduce the resistance of the parallel structure, for example, the electric connection layer 400 may be formed of a metal material, such as metallic copper. In order to guarantee the high light transmittance of the light emitting element, for example, the thickness of the electric connection layer 400 is not greater than 10 nm. In order to ensure that the electric connection layer 400 is attached to the conductive layer 322, for example, the electric connection layer 400 may be formed using an atomic layer deposition process (ALD).

In the embodiment of the present disclosure, the specific shape and structure of the insulating block 321 are not particularly limited. As shown in FIG. 1, for the same insulating block 321, the farther away from the base substrate 500, the greater the cross section of the insulating block 321 in a direction parallel with the surface of the base substrate 500. For example, the cross section of the insulating block 321 in a direction perpendicular to the base substrate 500 has a shape of an inverted trapezoid.

Since the organic material has poor step coverage and is difficult to be attached to the side surface of the conductive supporting block 320, the light emitting layer 113 breaks off or has a crack at the corresponding second structural area 200, thereby exposing at least a part of the side surface of the conductive supporting block 320 and allowing the electric connection of the electric connection layer 400 with the conductive supporting block 320. The atomic layer deposition process contributes to the formation of a thin film with better step coverage, and a continuous film layer may be formed by the atomic layer deposition process even if there is a large drop. For example, the film layer deposited by the atomic layer deposition process has a depth-to-width ratio of step coverage up to 35:1. Therefore, the electric connection layer 400 formed by the atomic layer deposition process may be effectively attached to the side surface of the conductive supporting block 320, and the electric connection of the electrode material layer with the conductive supporting block is implemented.

The ductility of the metal material is superior to that of the insulating material (including inorganic materials, organic materials). After the conductive layer 322 is formed, an insulating structure (for example, a light emitting material layer, etc.) of the display panel is inevitably formed, and the insulating block 321 has a structure in which "the farther away from the auxiliary electrode wire 310 where the insulating block 321 is provided, the greater the cross section of the insulating block 321", and the insulating material formed after the formation of the conductive layer 322 and before the formation of the electric connection layer 400 is prevented from being formed on the side surface of the conductive layer 322, thereby guaranteeing the stable electric connection between the electric connection layer 400 and the conductive layer 322.

For example, the light emitting layers 113 in the plurality of pixel areas 100 are connected one another to be an integral structure, and there is a gap at the corresponding second structural area 200 to expose at least a part of the side surface of the conductive supporting block 320.

In another example, the first structural area 300 is configured to separate the light emitting layers 113 of the light emitting elements around the first structural area 300, thereby avoiding the cross-talk and sneak lighting of the light emitting elements around the first structural area 300.

In order to simplify the manufacturing process, e.g., the first electrode 111 is made of the same material and is formed simultaneously as the conductive layer 322, and the first electrode 111 and the conductive layer 322 are provided in the same layer and made of the same material.

It should be noted that in the present embodiment of the disclosure, "provided in the same layer" refers to a multi-layer structure formed of the same material layer by the same or different pattering process, thus the same material.

For example, the first electrode 111 is made of one or more metal materials and has a low resistivity. Accordingly, the conductive layer 322 also has a lower resistivity, so that the resistance of the parallel structure including the electrode material layer may be lowered.

In order to attach the conductive layer 322 at the side surface of the insulating block 321, for example, the conductive layer 322 and the first electrode 111 may be formed using the atomic layer deposition process.

For example, the pixel area 100 may further include a pixel defining layer 120 which has a pixel opening, in which, a portion of the light emitting layer of the light emitting element is provided. In forming the display panel, the first electrode 111 is formed first, and then the pixel defining layer 120 is formed, and finally the electrode material layer is formed. A part of the electrode material layer falls within the pixel opening.

A part of the first electrode 111 is exposed within the corresponding pixel opening, such that the part of the light emitting layer 113 falling within the pixel opening is attached to the first electrode 111, and the second electrode 112 is attached to the light emitting layer 113.

For example, the pixel area 100 further includes a driving circuit for driving the light emitting element to emit light. In the embodiments of the present disclosure, the driving circuit is formed first, and then the first electrode 111 of the light emitting element is formed. Accordingly, the driving circuit is located at one side of the first electrode 111 close to the base substrate 500, and the driving circuit includes a plurality of thin film transistors 130 which includes a plurality of spaced driving electrode layers, and the auxiliary electrode wire 310 is provided in the same layer and made of the same material as one of the plurality of driving electrode layers.

Since the auxiliary electrode wire 310 is provided in the same layer as one of the driving circuit layers in the driving circuit, the manufacturing process of manufacturing the display panel may be simplified, and the cost is lowered.

As shown in FIG. 1, a plurality of driving electrode layers of the thin film transistor 130 includes a source-drain electrode layer and a gate electrode layer. For example, the auxiliary electrode wire 310 is provided in the same layer as the gate electrode layer. It should be noted that the gate electrode layer includes a gate, and the source-drain electrode layer includes a source electrode and a drain electrode.

For example, the thin film transistor 130 is a top gate type thin film transistor, and accordingly, the thin film transistor 130 further includes an interlayer insulating layer 131, a passivation layer 132, and a planarization layer 133. Correspondingly, the interlayer insulating layer 131 covers the gate electrode layer, and the source-drain electrode layer is provided on the interlayer insulating layer 131 to insulate the gate electrode layer from the source-drain electrode layer using the interlayer insulating layer 131, the passivation layer 132 covers the source-drain electrode layer and the part of the interlayer insulating layer 131 where the source-drain electrode layer is not provided, and the planarization layer 133 covers the passivation layer 132. As shown in FIG. 1, the first electrode 111 is provided on the planarization layer 133, and the first electrode 111 is electrically connected with the drain through a via hole penetrating through the planarization layer 133 and the interlayer insulating layer 131.

In order to simplify the manufacturing process, for example, the insulating block 321 further includes an interlayer insulating portion 321a which is provided in the same layer and made of the same material as the interlayer insulating layer 131, a passivation portion 321b which is provided in the same layer and made of the same material as the passivation layer 132, and a planarization portion 321c which is provided in the same layer and made of the same material as the planarization layer 133.

How to form the insulating block will be described in detail below, and will not be described herein.

As described above, the farther away from the base substrate 500, the greater the cross section of the insulating block 321, and the insulating block 321 with this structure may be formed by controlling the etching process. For ease of molding, for example, the compactness of the interlayer insulating layer 131 gradually increases from the bottom up, and under the same etching conditions, an etching rate of the interlayer insulating layer 131 decreases gradually from bottom up. In this way, the insulating block 321 with a small bottom area and a large top area may be obtained without changing the etching process.

For example, the interlayer insulating layer 131 includes silicon oxynitride (SiOxNy), and the higher the nitrogen content, the higher the compactness of the interlayer insulating layer 131. For example, the interlayer insulating layer 131 includes a first interlayer insulating layer, a second interlayer insulating layer, and a third interlayer insulating layer which are sequentially stacked in a direction away from the gate electrode layer. The first interlayer insulating layer is made of silicon oxide, the second interlayer insulating layer is made of silicon oxynitride, and the third interlayer insulating layer is made of silicon nitride. Correspondingly, the interlayer insulating portion 321a includes a first interlayer insulating portion which is provided in the same layer and made of the same material as the first interlayer insulating layer, a second interlayer insulating portion which is provided in the same layer and made of the same material as the second interlayer insulating layer, and a third interlayer insulating portion which is provided in the same layer and made of the same material as the third interlayer insulating layer.

For example, the passivation portion 321b includes silicon nitride (SiNy), and the higher the nitrogen content of silicon, the higher the compactness of the passivation portion 321b. For example, in the direction away from the base substrate (i.e. from bottom up), the silicon content in the passivation portion 321b gradually increases. Under the same etching process conditions, an etching rate of the passivation layer 132 decreases gradually from bottom up. That is, the passivation portion 321b with a small bottom area and a large top area may be obtained.

In order to facilitate the formation of the planarization portion 321c with a small bottom area and a large top area, for example, the planarization layer 133 is made of a negative photoresist, and the planarization portion 321c is also made of a negative photoresist. After a planarization material layer made of a negative photoresist is coated to the whole layer, an exposure process is performed on the planarization material layer. The deeper the part of the planarization material layer, the lower the photosensibility. Therefore, the planarization material layer is exposed using a common mask, and the planarization portion 321c with a small bottom area and a large top area may be obtained after development.

It is easily understood that, as shown in FIG. 2, the plurality of pixel areas 100 are arranged in a plurality of rows and columns. In order to conveniently provide the auxiliary electrode wires, preferably, the auxiliary electrode wires 310 extend in the column direction of the pixel area. In the embodiment shown in FIG. 2, the auxiliary electrode wire 310 is located between two adjacent columns of pixel areas.

It should be noted that the pixel area 100, the second structural area 200, and the first structural area 300 are all located on the base substrate 500. The bottom of the second structural area 200 may be formed with a residual material formed when the second electrode, the first electrode, the light emitting layer, or the like are formed.

In the embodiment where the light emitting element is an organic light emitting diode, the first electrode may be an anode, and the second electrode may be a cathode.

Figure 3:
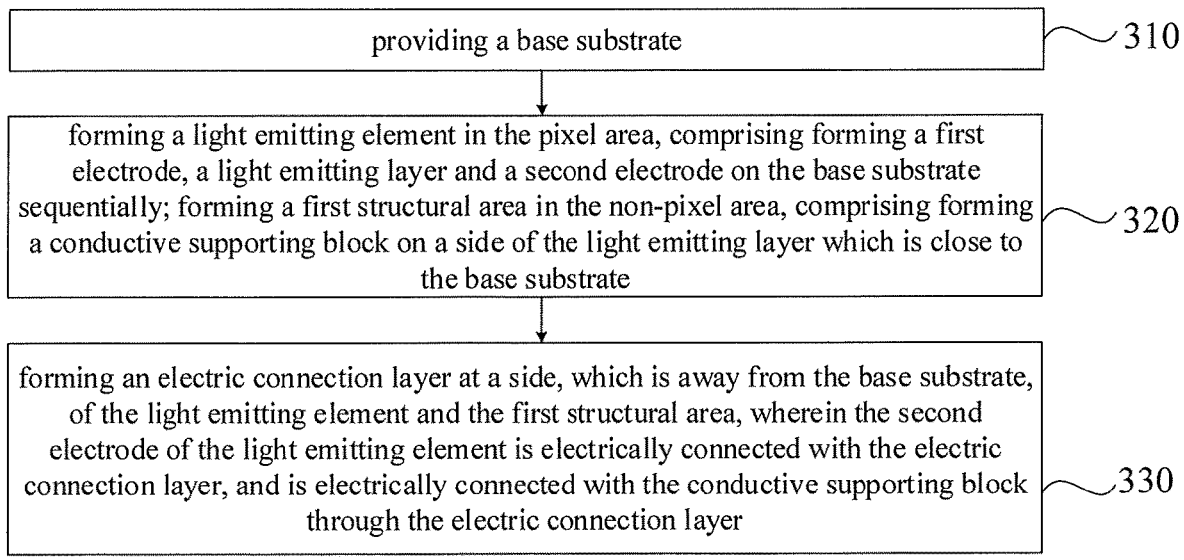
FIG. 3 is a flow chart of a manufacturing method of a display panel according to some embodiments of the present disclosure.

The embodiments of the present disclosure further provide a method of manufacturing the above-mentioned display panel. As shown in FIG. 3, the manufacturing method at least includes: step S310: providing a base substrate; step S320: forming a light emitting element in the pixel area, including sequentially forming a first electrode, a light emitting layer and a second electrode on the base substrate; forming a first structural area in the non-pixel area, including forming a conductive supporting block at a side of the light emitting layer close to the base substrate; and step S330: forming an electric connection layer at a side, which is away from the base substrate, of the light emitting element and the first structural area, the second electrode of the light emitting element electrically connected with the electric connection layer, and with the conductive supporting block through the electric connection layer.

The above-mentioned display panel according to the present disclosure may be manufactured by the manufacturing method according to the present disclosure. The method of manufacturing the display panel in some embodiments has been described in detail above, and will not be described herein.

For example, the manufacturing method may further include forming a second structural area in the non-pixel area. The second structural area includes a groove exposing at least a side surface of the conductive layer, and the electric connection layer is electrically connected with the exposed side surface of the conductive layer through the second structural area.

In an example, referring to FIG. 1, the step S320 may include: forming a pattern including a gate electrode layer; forming an interlayer insulating material layer; performing a patterning process on the interlayer insulating material layer, etching away a part of the interlayer insulating material layer corresponding to the second structural area, to obtain an interlayer insulating layer and an interlayer insulating portion; forming a pattern including a source-drain layer, wherein the auxiliary electrode wire is formed in the step of forming the pattern including the gate electrode layer or in the step of forming the pattern including the source-drain layer; forming a passivation material layer; performing a patterning process on the passivation material layer, etching away a part of the passivation material layer corresponding to the second structural area, to obtain a passivation layer and a passivation portion; forming a planarization material layer; performing a patterning process on the planarization material layer, removing the part of the planarization material layer corresponding to the second structural area, to obtain a planarization layer and a planarization portion, so that the interlayer insulating portion, the passivation portion and the planarization portion together constitute an insulating block; forming a pattern including a conductive layer, the conductive layer cladding the insulating block to obtain the supporting block; forming a pattern including a plurality of insulated first electrodes; forming a pixel defining layer, the pixel defining layer including a plurality of pixel openings, the plurality of pixel openings being in one-to-one correspondence with the plurality of the first electrodes, and a part of the second electrode being exposed in the corresponding pixel opening; forming a light emitting layer, a part of which falls within the pixel opening; forming an electrode material layer, a part of which falls within the pixel opening, the part of the electrode material layer located in the pixel opening being formed as the second electrode, and for the same pixel opening, a part of the corresponding first electrode, the second electrode, and a part of the light emitting layer are formed as the light emitting element.

The gate electrode layer and the source-drain layer are located in the pixel area, and are formed as a part of a thin film transistor of a driving circuit which is configured to drive the light emitting element.

The display panel shown in FIG. 1 may be obtained based on the above-mentioned method. The passivation layer and the passivation portion may be formed in a same patterning process, the interlayer insulating layer and the interlayer insulating portion are formed in a same patterning process, and the planarization layer and the planarization portion are formed in a same patterning process, such that the manufacturing method is simpler, and the cost of manufacturing the display panel is lowered.

In order to further simplify the manufacturing method, for example, the step of forming the first electrode of the light emitting element is performed in synchronization with the step of forming a conductive layer, for example, in the same patterning process.

For example, the step of forming a pattern including the first electrode may be performed by the atomic layer deposition process, thereby ensuring that the outer surface of the insulating block is fully covered by the conductive layer and the conductive layer is electrically connected with the auxiliary electrode wire.

In the present disclosure, the material for performing the atomic layer deposition process is not particularly limited. For example, the first electrode may be made of metallic copper, and accordingly, the step of forming a pattern including the first electrode performed by the atomic layer deposition process includes the following steps performed alternately: injecting gas of an organic complex of copper into a process chamber and depositing on a surface of the substrate; injecting reducing gas into the process chamber, such that the reducing gas reacts with the organic complex of copper on the surface of the substrate to generate gas and a copper atomic layer.

In order to conveniently form the planarization portion with a small bottom area and a large top area, preferably, the planarization material layer is made of a negative photosensitive material.

In order to obtain an insulating block with a small bottom area and a large top area without changing the etching process, for example, the compactness at the bottom of the interlayer insulating material layer is less than that at the top of the interlayer insulating layer. Accordingly, the step of forming an interlayer insulating material layer includes: injecting silane and nitrous oxide into a process chamber provided with a base substrate; after a first predetermined period of time, injecting silane, nitrous oxide and ammonia gas into the process chamber, and gradually increasing the amount of ammonia gas injected into the process chamber and gradually decreasing the amount of nitrous oxide injected into the process chamber as the process progresses until the injected amount of nitrous oxide is reduced to zero; maintaining the injected amount of ammonia gas when the injected amount of nitrous oxide is zero, and keeping injecting the silane, and obtaining the interlayer insulating material layer including the first interlayer insulating material layer, the second interlayer insulating material layer, and the third interlayer insulating material layer after a second predetermined period of time, the first interlayer insulating material layer made of an silicon oxide, the second interlayer insulating material layer made of silicon oxynitride, and the third interlayer insulating material layer made of silicon nitride.

For example, the step S330 may include: forming an electric connection layer, the electric connection layer extending through the pixel area, the second structural area and the first structural area, the electric connection layer electrically connecting the electrode material layer with the conductive layer, such that the electrode material layer is electrically connected with the auxiliary electrode wire.

In order to conveniently attaching the electric connection layer to the surface (including the side surface) of the conductive layer, for example, the electric connection layer is formed using the atomic layer deposition process.

In the present disclosure, the electric connection layer with a thickness not larger than 10 nm may be made of copper. For example, the step of forming the electric connection layer performed by the atomic layer deposition process includes the following steps alternately performed: injecting gas of an organic complex of copper into a process chamber and depositing on a surface of the substrate; injecting reducing gas into the process chamber, such that the reducing gas reacts with the organic complex of copper on the surface of the substrate to form gas and a copper atomic layer.

In another example, the method of manufacturing the display panel shown in FIG. 1 includes following steps S410-S422.

S410: providing a base substrate; forming a pattern including an active layer on the base substrate; for example, depositing an IGZO film layer on the base substrate using a physical vapor deposition process, and forming a pattern including the active layer by photolithography and etching.

S411: forming a gate insulating layer; for example, depositing the gate insulating layer on the base substrate on which the pattern including the active layer is formed, by chemical vapor deposition or plasma enhanced chemical vapor deposition, the gate insulating layer being made of silicon nitride, silicon oxide, or a lamination of the two materials; forming a gate contact hole by photolithography and etching processes.

S412: forming a pattern including the gate and forming an auxiliary electrode layer on the gate insulating layer by the physical vapor deposition film formation technique and a mask etching process, wherein the gate material may be one or more of Al, Mo, Cu, Ti.

S413: forming an interlayer insulating layer; for example, depositing an interlayer insulating layer on the base substrate on which the gate is formed by the chemical vapor deposition process, allowing the compositions of the thin film to change in gradient by controlling the process conditions, such as a gas flow ratio, a reaction gas pressure during the deposition process, or the like. The composition at the lowest layer is silicon oxide (SiOx). As an increase in the film thickness, the N content increases gradually, and the 0 content gradually decreases. The composition at the topmost layer is silicon nitride (SiNy) and that of the middle layer is silicon oxynitride (SiOxNy), thereby forming a film layer structure with a compactness increasing gradually and the etching rate gradually decreasing from bottom up. Forming a contact hole of a source via hole and a drain via hole and a passivation portion of the insulating block by the photolithography and etching processes.

S414: forming a pattern including the source-drain electrode; for example, manufacturing a source-drain metal film layer by the physical vapor deposition process, and performing patterning by the photolithography and etching processes to form a pattern including the source-drain electrode. The source-drain metal layer material may be one or more of Al, Mo, Cu, Ti.

S415: forming a passivation layer on the base substrate on which the pattern including the source electrode and the drain electrode are formed; for example, forming the passivation layer of silicon nitride by the chemical vapor deposition process; controlling the composition of the thin film by controlling the gas flow ratio during thin film deposition, i.e., with an increase in the film thickness, gradually increasing the Si content, and gradually increasing the thin film compactness. Forming a pixel electrode contact hole by the photolithography and etching processes, and simultaneously forming a passivation portion of the insulating block.

S416: forming a planarization layer; for example, on the passivation layer, forming a planarization layer using spin coating, transferring or inkjet printing process, to provide a flat surface for the deposition of the pixel electrode, forming a planarization layer using a negative photoresistive polymer (negative photoresist), and forming a planarization portion of the insulating block by the photolithography and developing processes using the characteristics of the negative photoresist that the absorbed quantity of illumination gradually increases with an increase in the film thickness.

S417: forming a pattern including the first electrode; for example, depositing a pixel electrode layer on the surface of the planarization layer by an atomic layer deposition process, taking one or more of Ag, Al, and ITO as the pixel electrode material, and the film layer structure may be a single-layer or laminated structure. A patterned pixel electrode is made by photolithography and etching in synchronization with the conductive layer cladding the insulating block, and the conductive layer is in electrical contact with the auxiliary electrode wire.

S418: forming a pixel defining layer; for example, making a pixel defining material layer on the base substrate on which the first electrode is formed using spin coating, transferring or inkjet printing process, by the photolithography and etching processes, patterning the pixel defining layer to form a plurality of pixel openings and the part of the auxiliary groove penetrating through the pixel defining layer.

S419: forming a light emitting functional layer; for example, sequentially evaporating an organic electroluminescent layer on a ready-made array substrate by an evaporation process, the organic material having poor step coverage, and broking on the corners and side walls of the inverted trapezoidal separating wall, so that the side walls of the auxiliary electrode may be exposed.

S420: forming an electrode material layer; for example, forming an electrode material layer made of an ITO material by the evaporation process.

S421: forming an electric connection layer by the atomic layer deposition process.

S422: packaging, for example, using a color film glass or a polymer barrier film to package the ready-made OLED display panel.

What are described above is related to the illustrative embodiments of the disclosure only and not limitative to the scope of the disclosure; the scopes of the disclosure are defined by the accompanying claims.

What is claimed is:

1. A display panel, comprising a base substrate, and a pixel area and a non-pixel area outside the pixel area on the base substrate,
   wherein the pixel area comprises a light emitting element, the light emitting element comprising a first electrode, a light emitting layer, and a second electrode which are sequentially on the base substrate, wherein the second electrode is on a side of the first electrode away from the base substrate;
   the non-pixel area comprises a first structural area, the first structural area comprising a conductive supporting block which is on one side of the light emitting layer close to the base substrate;
   the display panel further comprises an electric connection layer which is on one side, which is away from the base substrate, of the second electrode of the light emitting element and the first structural area; and
   the second electrode of the light emitting element is electrically connected with the electric connection layer, and is electrically connected with the conductive supporting block through the electric connection layer.

2. The display panel according to claim 1, wherein the conductive supporting block comprises an insulating block and a conductive layer cladding the insulating block, and the electric connection layer is electrically connected with the conductive layer.

3. The display panel according to claim 2, wherein the non-pixel area further includes a second structural area between the pixel area and the first structural area, the second structural area comprises a groove exposing at least a part of a side surface of the conductive layer, and the electric connection layer is electrically connected with the part of the side surface of the conductive layer through the second structural area.

4. The display panel according to claim 2, wherein a cross sectional area of the insulating block in a direction parallel with the base substrate increases along a direction away from the base substrate.

5. The display panel according to claim 2, wherein the first structural area further comprises an auxiliary electrode wire provided on one side, which is close to the base substrate, of the conductive supporting block;
   and the auxiliary electrode wire is electrically connected with the conductive layer.

6. The display panel according to claim 5, wherein a surface of the auxiliary electrode wire close to the conductive layer has an exposed portion which is exposed by the insulating block, and the conductive layer is electrically connected with the auxiliary electrode wire by directly contacting the exposed portion, without via holes.

7. The display panel according to claim 5, further comprising a driving circuit for driving the light emitting element to emit light, the driving circuit located on the other side, which is close to the base substrate, of the light emitting element,
   wherein the driving circuit comprises a thin film transistor which comprises a plurality of driving electrode layers spaced apart from each other, and the auxiliary electrode wire is in a same layer and made of a same material as one of the plurality of driving electrode layers.

8. The display panel according to claim 7, wherein the plurality of driving electrode layers of the thin film transistor comprise a source-drain electrode layer and a gate electrode layer, the auxiliary electrode wire is in a same layer as the gate electrode layer or the source-drain electrode layer.

9. The display panel according to claim 8, wherein the thin film transistor further comprises an interlayer insulating layer which is between the gate electrode layer and the source-drain electrode layer, to insulate the gate electrode layer from the source-drain electrode layer,
   the insulating block comprises an interlayer insulating portion which is in a same layer and made of a same material as the interlayer insulating layer.

10. The display panel according to claim 9, wherein the interlayer insulating layer comprises a first interlayer insulating layer, a second interlayer insulating layer, and a third interlayer insulating layer which are sequentially stacked in a direction away from the base substrate, wherein the first interlayer insulating layer is made of silicon oxide, the second interlayer insulating layer is made of silicon oxynitride, and the third interlayer insulating layer is made of silicon nitride, and wherein the interlayer insulating portion comprises a first interlayer insulating portion which is in a same layer and made of a same material as the first interlayer insulating layer, a second interlayer insulating portion which is in a same layer and made of a same material as the second interlayer insulating layer, and a third interlayer insulating portion which is in a same layer and made of a same material as the third interlayer insulating layer.

11. The display panel according to claim 7, further comprising a planarization layer between the driving circuit and the light emitting element,
   wherein the insulating block comprises a planarization portion which is provided in a same layer and made of a same material as the planarization layer.

12. The display panel according to claim 11, wherein the planarization layer and the planarization portion are both made of a negative photoresist.

13. The display panel according to claim 11, further comprising a passivation layer between the driving circuit and the planarization layer,
   wherein the insulating block further comprises a passivation portion which is in a same layer and made of a same material as the passivation layer.

14. The display panel according to claim 13, wherein the passivation portion comprises silicon nitride, and
   a silicon content in the passivation portion gradually increases in a direction away from the base substrate.

15. The display panel according to claim 5, comprising a plurality of pixel areas arranged in a first array along a first direction and a second direction, and a plurality of first structural areas arranged in a second array along the first direction and the second direction,
   wherein between every two rows of pixel areas is provided with one row of first structural areas.

16. The display panel according to claim 15, comprising a plurality of auxiliary electrode wires which are extended in the second direction and are corresponding to a plurality of columns of first structural areas in a one-to-one correspondence,
   wherein each auxiliary electrode wire is between two adjacent columns of pixel areas, and
   conductive layers in each column of first structural areas are electrically connected with one auxiliary electrode wire corresponding to the each column of first structural areas.

17. The display panel according to claim 2, wherein the conductive layer is in a same layer and made of a same material as the first electrode of the light emitting element.

18. The display panel according to claim 1, comprising a plurality of pixel areas,
   wherein a plurality of second electrodes of the plurality of pixel areas are electrically connected with each other to be an integral structure.

19. The display panel according to claim 1, wherein the pixel area further comprises a thin film transistor electrically connected with the light emitting element;
   the thin film transistor comprises an interlayer insulating layer which is between a gate electrode layer and a source-drain electrode layer of the thin film transistor;
   the pixel area further comprises a passivation layer and a planarization layer between the thin film transistor and the light emitting element, and the passivation layer is on a side of the planarization layer close to the base substrate;
   the first structural area further comprises an auxiliary electrode wire on a side of the conductive supporting block close to the base substrate;
   the conductive supporting block comprises an insulating block and a conductive layer sequentially on the auxiliary electrode wire, and the conductive layer clads the insulating block and is electrically connected with the auxiliary electrode wire by direct contact, without via holes;
   the insulating block comprises an interlayer insulating portion, a passivation portion, and planarization portion which are sequentially on the auxiliary electrode wire; and
   the interlayer insulating portion is in a same layer and made of a same material as the interlayer insulating layer, the passivation portion is in a same layer and made of a same material as the passivation layer, and the planarization portion is in a same layer and made of a same material as the planarization layer.

20. A manufacturing method of a display panel, the display panel comprising a pixel area and a non-pixel area outside the pixel area, the manufacturing method comprising:
   providing a base substrate;
   forming a light emitting element in the pixel area, comprising forming a first electrode, a light emitting layer, and a second electrode on the base substrate sequentially, wherein the second electrode is on a side of the first electrode away from the base substrate; forming a first structural area in the non-pixel area, comprising forming a conductive supporting block on one side, which is close to the base substrate, of the light emitting layer; and
   forming an electric connection layer on one side, which is away from the base substrate, of the second electrode of the emitting element and the first structural area,
   wherein the second electrode of the light emitting element is electrically connected with the electric connection layer, and is electrically connected with the conductive supporting block through the electric connection layer.

* * * * *